(12) United States Patent
Manetakis

(10) Patent No.: US 8,665,015 B1
(45) Date of Patent: Mar. 4, 2014

(54) POWER AMPLIFIER CIRCUIT

(75) Inventor: Konstantinos Manetakis, Nice (GR)

(73) Assignee: Cambridge Silicon Radio Limited, Cambridge (GB)

(*) Notice: Subject to any disclaimer, the term of this patent is extended or adjusted under 35 U.S.C. 154(b) by 4 days.

(21) Appl. No.: 13/588,330

(22) Filed: Aug. 17, 2012

(51) Int. Cl.
*H03G 3/00* (2006.01)

(52) U.S. Cl.
USPC .......................... 330/127; 330/256; 330/289

(58) Field of Classification Search
USPC .......................... 330/127, 256, 289
See application file for complete search history.

(56) References Cited

U.S. PATENT DOCUMENTS

| | | | | |
|---|---|---|---|---|
| 6,292,050 B1* | 9/2001 | Dooley et al. | | 327/540 |
| 6,335,661 B1* | 1/2002 | Furman | | 330/301 |
| 6,492,874 B1* | 12/2002 | Shih | | 330/288 |
| 7,199,646 B1* | 4/2007 | Zupcau et al. | | 327/539 |
| 7,710,190 B2* | 5/2010 | Oberhuber | | 327/512 |
| 8,427,227 B2* | 4/2013 | Horie et al. | | 327/513 |
| 2011/0227636 A1* | 9/2011 | Endo et al. | | 327/541 |

* cited by examiner

*Primary Examiner* — Patricia Nguyen
(74) *Attorney, Agent, or Firm* — Fulbright & Jaworski LLP

(57) ABSTRACT

A power amplifier circuit, comprising: an input for receiving an input signal to be amplified; a power supply; an amplifier, coupled to the input and the power supply; and a cascode device coupled between the power supply and the amplifier. The circuit is characterized by: a first current source coupled between the input and the amplifier, configured to provide a biasing current which is proportional to absolute temperature; and a second current source for controlling the cascode device, configured to provide a current which is complementary to absolute temperature (CTAT).

15 Claims, 3 Drawing Sheets

POWER AMPLIFIER CIRCUIT

TECHNICAL FIELD

The present invention relates to power amplifiers, and particularly to power amplifiers for use in the generation of radio-frequency signals.

BACKGROUND OF THE INVENTION

Power amplifier nonlinearities have a significant impact on the overall performance of modern digital communication systems.

The variation of the power amplifier gain with temperature plays an important role amongst power amplifier non-idealities. In order to ease the requirements placed on the rest of the transmit-chain blocks, such variation should be kept as small as possible. Baseband digital schemes exist to sense and counteract such variations, but their efficacy and viability depends on minimizing the gain variation in the analogue domain in the first place.

A further non-linearity is the AM-PM (amplitude modulation to phase modulation) non-ideal transfer characteristic. A great deal of effort is invested in complex baseband/digital pre-distortion schemes to sense and counteract its effects. For such schemes to be efficient and viable, however, the spread of AM-PM should be minimized in the analogue domain in the first place. Furthermore, this should ideally be achieved across the whole frequency range of operation, especially for power amplifiers that are required to operate over a very wide frequency range.

BRIEF SUMMARY OF THE INVENTION

According to a first aspect of the present invention, there is provided a power amplifier circuit, comprising: an input for receiving an input signal to be amplified; a power supply; an amplifier, coupled to the input and the power supply; and a cascode device coupled between the power supply and the amplifier. The circuit is characterized by: a first current source coupled between the input and the amplifier, configured to provide a biasing current which is proportional to absolute temperature; and a second current source for controlling the cascode device, configured to provide a current which is complementary to absolute temperature (CTAT).

BRIEF DESCRIPTION OF THE DRAWINGS

For a better understanding of the present invention, and to show more clearly how it may be carried into effect, reference will now be made, by way of example, to the following drawings, in which.

DETAILED DESCRIPTION OF THE INVENTION

Figure 1:
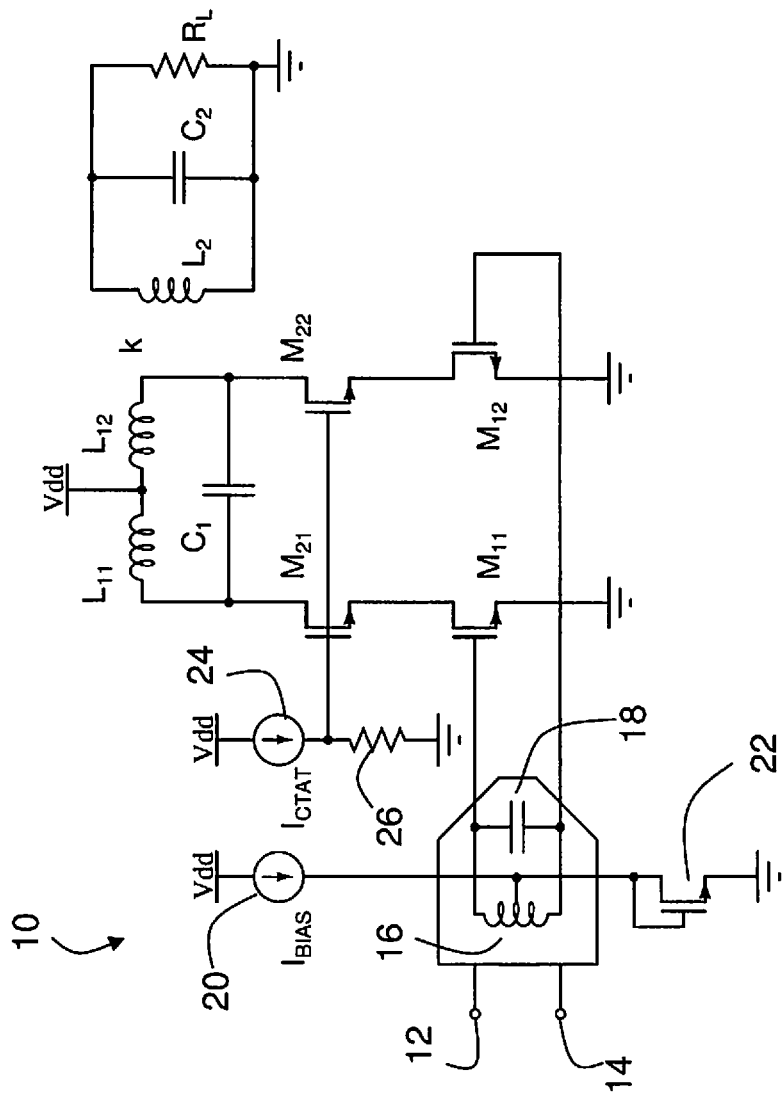
FIG. 1 shows a power amplifier circuit according to an embodiment of the present invention.

FIG. 1 shows a power amplifier circuit 10 according to an embodiment of the present invention.

The power amplifier circuit 10 comprises a final stage, for amplifying an input voltage and outputting via a load, and a driver stage (illustrated in part) used to interface the final stage to a mixer circuit (not illustrated).

Two inputs 12, 14 provide an input signal from the mixer circuit to the driver stage. The inputs 12, 14 are coupled to an inductor 16, such that an electrical signal corresponding to the input signal is induced in the inductor 16. A first end of the inductor 16 is coupled to an input gate of a first amplifying element $M_{11}$, and a second end of the inductor 16 is coupled to the input gate of a second amplifying element $M_{12}$. A capacitor 18 is coupled between the two ends of the inductor 16 and between the input gates of the two amplifying elements $M_{11}$ and $M_{12}$.

In order to set the DC level at the input gates of the amplifying elements $M_{11}$ and $M_{12}$, a current source 20 provides a biasing current $I_{BIAS}$, coupled between a supply voltage $V_{DD}$ and the drain terminal of a transistor 22. The drain terminal of the transistor 22 is also connected to the gate terminal of the transistor 22, and the source terminal is coupled to ground. A node between the current source 20 and the drain terminal of the transistor 22 is coupled to the inductor 16 part of the way along its length. In one embodiment the node is coupled to the mid-point of the inductor 16. In this way the current $I_{BIAS}$ supplied by the current source 20 sets the DC level at the input of each amplifying element $M_{11}$ and $M_{12}$. The operation of the current source 20 will be described in greater detail below.

The final stage of the amplifier circuit 10 comprises main amplifying elements $M_{11}$ and $M_{12}$, which in the illustrated embodiment are transistors. The gate terminal of each transistor is coupled to a respective end of the inductor 16, as described above, for receiving the signal to be amplified. The source terminal of each transistor is coupled to a reference voltage (in the illustrated example, ground), and the drain terminal of each transistor is coupled, indirectly, to a supply voltage $V_{DD}$. An inductor $L_{11}$ is coupled in series between the drain terminal of the transistor $M_{11}$ and the supply voltage $V_{DD}$; that is, a first end of the inductor $L_{11}$ is coupled to the drain terminal of the transistor $M_{11}$ while a second end of the inductor $L_{11}$ is coupled to the supply voltage $V_{DD}$. A further inductor $L_{12}$ is coupled in series between the drain terminal of the transistor $M_{12}$ and the supply voltage $V_{DD}$; that is, a first end of the inductor $L_{12}$ is coupled to the drain terminal of the transistor $M_{12}$ while a second end of the inductor $L_{11}$ is coupled to the supply voltage $V_{DD}$. Further, the respective second ends of the inductors $L_{11}$ and $L_{12}$ are coupled to each other. A capacitor $C_1$ is coupled between the respective first ends of the inductors $L_{11}$ and $L_{12}$.

Inductors $L_{11}$ and $L_{12}$ form part of a transformer, and are magnetically coupled (by a coupling factor k) to an inductor $L_2$. The inductor $L_2$ is coupled in parallel with a second capacitor $C_2$ and a load $R_L$. In one embodiment, the load $R_L$ is an antenna. A reference voltage (in the illustrated embodiment, ground) is coupled to a terminal each of the inductor $L_2$, the capacitor $C_2$ and the load $R_L$.

In operation of the power amplifier circuit 10, a signal is input via the inputs 12, 14 and a corresponding signal induced in the inductor 16, which is biased by the current $I_{BIAS}$ developed in current source 20. Signals to be amplified are thus input to the amplifying elements $M_{11}$ and $M_{12}$, and corresponding amplified signals generated in the inductors $L_{11}$ and $L_{12}$. A further signal is induced in the inductor $L_2$, and eventually output to the load $R_L$.

According to embodiments of the present invention, the DC voltage at the drains of the amplifying transistors $M_{11}$ and $M_{12}$ is further controlled by coupling cascode devices $M_{21}$ and $M_{22}$ between the drain terminals of the devices and the inductors $L_{11}$ and $L_{12}$. That is, a first cascode device $M_{21}$ (in the illustrated embodiment, a transistor) is configured with its source terminal connected to the drain terminal of the amplifying element $M_{11}$, and its drain terminal connected to the first end of the inductor $L_{11}$ (and also a first terminal of the capacitor $C_1$); a second cascode device $M_{22}$ (in the illustrated embodiment, a transistor) is configured with its source terminal connected to the drain terminal of the amplifying element $M_{12}$, and its drain terminal connected to the first end of the inductor $L_{12}$ (and also a second terminal of the capacitor $C_1$). The gate terminals of both cascode devices $M_{21}$ and $M_{22}$ are controlled by a biasing circuit comprising a current source 24 generating current $\gamma i_{CTAT}$ coupled between a supply voltage VDD and a first terminal of a resistor 26 (where $\gamma$ is a scaling constant). The second terminal of the resistor 26 is coupled to a reference voltage (in the illustrated embodiment, ground). The gate terminals of the cascade devices $M_{21}$ and $M_{22}$ are connected to a node between the current source 24 and the resistor 26.

As described above, a common problem associated with power amplifier circuits is variation of the power amplifier gain with temperature. Ideally such variation should be kept as small as possible. According to embodiments of the present invention, variation of the amplifier gain with temperature is reduced by biasing the input terminals of the amplifying elements with a current which is proportional to absolute temperature, and by controlling the output terminals of the amplifying elements with cascode devices which are themselves biased with a current which is complementary to absolute temperature. In embodiments of the present invention, the current used to bias the input terminals of the amplifying elements is proportional to absolute temperature (i.e. directly proportional, $I \propto T$) with a constant which is positive; the current used to bias the gate terminals of the cascode devices is proportional to absolute temperature (i.e. directly proportional, $I \propto T$) with a constant which is negative. The two constants do not generally have the same magnitude.

In one embodiment the current source 20 generates a current $I_{BIAS}$ which is proportional to absolute temperature, with a constant of proportionality equal to $(1+\beta)$ where $\beta$ is a positive real number. The current source 24 generates a current $\gamma I_{CTAT}$ which is complementary to absolute temperature where $\gamma$ is a scaling constant.

Figure 2:
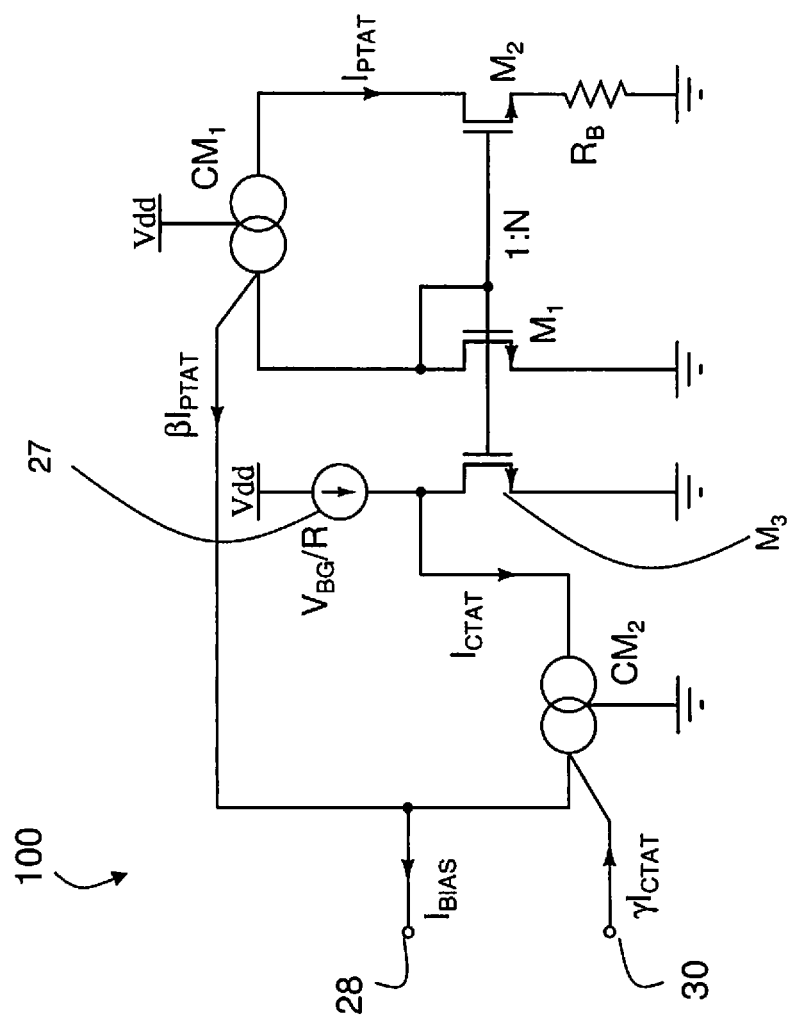
FIG. 2 shows a circuit for generating the bias currents utilized in the power amplifier circuits according to embodiments of the present invention.

Those skilled in the art will appreciate that the current sources 20, 24 may form different parts of the same circuit. That is, the same circuit may be used to generate both $I_{BIAS}$ and $I_{CTAT}$. FIG. 2 shows a circuit 100 according to embodiments of the present invention which may be used to generate both currents.

The circuit 100 first generates a current which is proportional to absolute temperature $I_{PTAT}$, and then generates the further currents $I_{CTAT}$ and $I_{BIAS}$ by manipulating $I_{PTAT}$ in combination with various reference currents. A bias resistor $R_B$ is coupled between a reference voltage (in the illustrated embodiment, ground) and the source terminal of a transistor $M_2$. The drain terminal of the device $M_2$ is coupled to a supply voltage $V_{DD}$ (via a current mirror $CM_1$). A further transistor $M_1$ is configured with its drain terminal also coupled to the supply voltage $V_{DD}$ via the current mirror $CM_1$, and its source terminal coupled to a reference voltage (in the illustrated embodiment, ground). The gate and drain terminals of the device $M_1$ are connected together, and the gate terminals of the devices $M_1$ and $M_2$ are also connected together. The devices $M_1$ and $M_2$ thus form a current mirror.

The difference in gate-source voltages ($\Delta V_{GS}$) of the two devices $M_1$ and $M_2$ varies proportionally to absolute temperature, and thus a current $I_{PTAT}$ is generated flowing into the drain terminal of the transistor $M_2$ which also varies proportionally to absolute temperature according to the following relationship:

$$I_{PTAT} = \frac{2}{R_B^2 \mu C_{ox} \frac{W}{L}} \left(1 - \frac{1}{\sqrt{N}}\right)^2 \quad (1)$$

where $\mu$, $C_{ox}$ and $$\frac{W}{L}$$

are the mobility, oxide capacitance and aspect ratio of the devices respectively. N is the $M_1/M_2$ device ratio, i.e. $1:N=M_1:M_2$. The mobility $\mu$ varies inversely with absolute temperature, and thus $I_{PTAT}$ varies proportionally to absolute temperature.

The value of $I_{PTAT}$ can be controlled by varying $R_B$ and/or N. Schemes for varying these quantities are illustrated in FIGS. 3 and 4, respectively.

Figure 3:
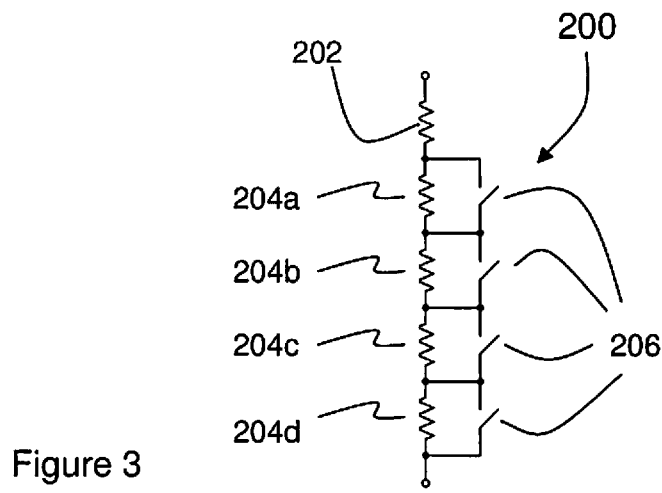
FIG. 3 shows a circuit for varying the resistor $R_B$ in FIG. 2.

FIG. 3 shows part of a circuit 200 for varying the biasing resistor $R_B$, and comprises a first resistor 202, having resistance R. One or more further resistors 204 are connected in series with the first resistor 202 (in FIG. 3, four further resistors 204a-d) are illustrated) and a short-circuit path provided around each further resistor 204. Switches 206 are provided in each short-circuit path and may be used selectively to couple the further resistors 204 into the conductive path, so selectively increasing the resistance of the combination of all resistors 202, 204. The total resistance of all resistors in the conductive path provides $R_B$. The resistors 202, 204 may individually have the same or different resistances. An advantage of providing different resistances is that more variation in the value of $R_B$ is allowed due to the greater number of different combination possible. Those skilled in the art will appreciate that alternative schemes may be provided to change the value of $R_B$. For example, the resistors 202, 204 may be connected in parallel rather than series without substantially affecting the operation of the circuit.

Figure 4:
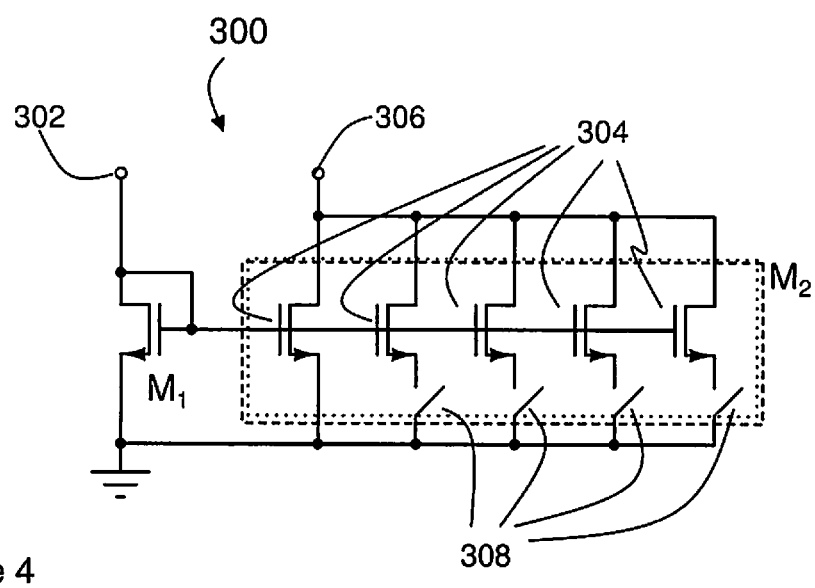
FIG. 4 shows a circuit for varying the device ratio $M_1:M_2$ in FIG. 2.

FIG. 4 shows a circuit 300 for varying the value of N, the device ratio between $M_1$ and $M_2$. The circuit 300 shows transistor $M_1$, with its drain terminal coupled to a first intermediate node 302, its gate terminal connected to its drain terminal, and its source terminal connected to a reference voltage (in the illustrated embodiment, ground). The second transistor, $M_2$, actually comprises a plurality of transistor elements 304 coupled in parallel with each other. That is, the gate terminals of each transistor element 304 are connected to the gate terminal of the transistor $M_1$, the drain terminals are all connected to a second intermediate node 306, and the source terminals are all connected to the reference voltage (i.e. ground). In the illustrated embodiment there are five transistor elements 304 but any number may be provided. Switches 308 are provided in the conduction path for each transistor element 304 but one, and by selectively switching the transistor elements 304 into and out of the conduction path from the second intermediate node 306 to the reference voltage, the effective aspect ratio of the device $M_2$ can be varied (and hence N).

$I_{PTAT}$ may thus be varied as required by varying N and/or $R_B$.

Returning to FIG. 2, a further transistor $M_3$ is configured with its gate terminal coupled to the gate terminals of $M_1$ and $M_2$, its source terminal coupled to a reference voltage (in the illustrated embodiment, ground), and its drain terminal coupled to a supply voltage $V_{DD}$. The device ratio $M_2:M_3$ is equal to 1:1 and thus the current into the drain terminal of the device $M_3$ is equal to $I_{PTAT}$. A current source 27 is coupled between the supply voltage and the drain terminal of the device $M_3$, and provides a constant reference current. In one embodiment, the reference current is generated by way of a bandgap voltage $V_{BG}$ over a resistance R. A node coupled between the drain terminal of the device $M_3$ and the current source 27 can thus draw off a current equal to $$\frac{V_{BG}}{R} - I_{PTAT} = I_{CTAT}.$$

$I_{CTAT}$ and $I_{PTAT}$ can then be combined to create the currents used to bias the amplifying elements $M_{11}$ and $M_{12}$ and the cascode devices $M_{21}$ and $M_{22}$. The circuit 100 comprises two current mirrors $CM_1$ and $CM_2$. The first current mirror $CM_1$ has four connections, two to the drain terminals of the devices $M_1$ and $M_2$, one to the supply voltage $V_{DD}$, and a further connection to a first output node 28 of the circuit 100. The current flowing towards the first output node 28 from the current mirror $CM_1$ can be made to mirror $I_{PTAT}$, flowing into the drain terminal of device $M_2$. By manipulation of the device ratios in the current mirror $CM_1$, the current flowing towards the output node 28 from $CM_1$ can be made proportional to $I_{PTAT}$, scaled by a factor β. In one embodiment, β can be made variable, as will be shown below.

The second current mirror $CM_2$ also has four connections, and is coupled between the node referred to above, drawing off $I_{CTAT}$, a reference voltage (in the illustrated embodiment, ground), the first output node 28, and a second output node 30. Again, by manipulation of the device ratios in the current mirror CM2, the current flowing towards the first output node 28 can be made equal to $I_{CTAT}$, and the current flowing towards the second output node 30 equal to $\gamma I_{CTAT}$, where γ is a scaling constant.

The first output node 28 provides $I_{BIAS}$ and is thus equivalent to the current source 20 shown in FIG. 1. The second output node 30 provides $\gamma i_{CTAT}$ and is equivalent to the current source 24 shown in FIG. 1. The scaling constant γ allows further close control of the biasing current, as well as control over the choice of resistance value for the resistor 26 (cf FIG. 1).

The biasing current generated at the first output node 28 is thus equal to:

$$I_{BIAS} = \beta I_{PTAT} - I_{CTAT} \quad (2)$$

$$= \beta I_{PTAT} - \left(\frac{V_{BG}}{R} - I_{PTAT}\right)$$

$$= (\beta + 1) I_{PTAT} - \frac{V_{BG}}{R}$$

From equation (2) it is clear that $I_{BIAS}$ varies proportionally with absolute temperature (as $I_{PTAT}$ varies proportionally with absolute temperature) and that variation can be controlled by varying the value of β. As will be clear from the description above, the value of β is determined by the device ratio in the current mirror $CM_1$. Those skilled in the art will appreciate that this may be varied by using a scheme as illustrated in FIG. 4, whereby the value of N is varied by selectively switching transistor elements into or out of a conduction path in the current mirror $CM_1$. Likewise, the value of γ may be varied by selectively switching transistor elements into or out of a conduction path in the current mirror $CM_2$.

The power amplifier circuit 10 thus comprises an amplifier whose input (DC level) is biased using a current which varies in a way which is proportional to absolute temperature. The output (DC level) of the amplifier is controlled indirectly via one or more cascode devices whose gate terminals are biased with a current which varies in a way which is complementary to absolute temperature. The inventors have found that the best performance is achieved when the temperature variation of the current biasing the input is generally greater (i.e. steeper slope) than the temperature variation of the current which biases the gates of the cascode device(s). In this way, the gain variation with temperature can be reduced from more than 2 dB to less than 1 dB over a typical working temperature range (e.g. −40° C. to 120° C.) without any penalty in the large-signal behaviour of the circuit (i.e. AM-AM and compression point).

Those skilled in the art will appreciate that various amendments and alterations can be made to the embodiments described above without departing from the scope of the invention as defined in the claims appended hereto.

What is claimed is:

1. A power amplifier circuit, comprising:
   an input for receiving an input signal to be amplified;
   a power supply;
   an amplifier, coupled to the input and the power supply; and
   a cascode device coupled between the power supply and the amplifier;
   characterized by:
   a first current source coupled between the input and the amplifier, configured to provide a biasing current which is proportional to absolute temperature; and
   a second current source for controlling the cascode device, configured to provide a current which is complementary to absolute temperature (CTAT).

2. The power amplifier circuit according to claim 1, wherein the biasing current is proportional to absolute temperature with a proportionality constant equal to (1+β), where β is a positive number, and wherein the CTAT current is complementary to absolute temperature.

3. The power amplifier circuit according to claim 2, wherein β is variable.

4. The power amplifier circuit according to claim 2 or 3, further comprising a third current source for generating a current which is proportional to absolute temperature (PTAT).

5. The power amplifier circuit according to claim 4, wherein the first current source is configured to generate the biasing current by generating a current equal to $\beta . I_{PTAT}$ and subtracting the CTAT current.

6. The power amplifier circuit according to claim 5, wherein the first current source comprises a current mirror having at least two transistors, at least one of said transistors having a variable aspect ratio for varying a device ratio in order to vary β.

7. The power amplifier circuit according to any one of claims 4 to 6, wherein the CTAT current is generated by subtracting the PTAT current from a reference current.

8. The power amplifier circuit according to claim 7, further comprising a bandgap voltage circuit for generating the reference current.

9. The power amplifier circuit according to any one of claims 4 to 8, wherein the third current source comprises a $\Delta V_{GS}$ voltage drop across a resistor ($R_B$).

10. The power amplifier circuit according to claim 9, wherein the resistor comprises a plurality of resistive elements and one or more switches for short-circuiting one or more of said resistive elements.

11. The power amplifier circuit according to any one of claims 4 to 10, wherein the third current source comprises a current mirror having at least two transistors, at least one of said transistors having a variable aspect ratio for varying a device ratio and thus varying the PTAT current.

12. The power amplifier circuit according to any one of the preceding claims, wherein the amplifier comprises a transistor.

13. The power amplifier circuit according to any one of the preceding claims, wherein the second current source is coupled to a gate terminal of the cascode device.

14. The power amplifier circuit according to any one of the preceding claims, wherein the amplifier comprises first and second transistors, and wherein the circuit further comprises a second cascode device also controlled by the second current source, the first cascode device being coupled between the first transistor and the power supply, and the second cascode device being coupled between the second transistor and the power supply.

15. A transmitter, comprising a power amplifier circuit according to any one of the preceding claims and an antenna coupled to the power amplifier circuit.

\* \* \* \* \*

UNITED STATES PATENT AND TRADEMARK OFFICE
CERTIFICATE OF CORRECTION

PATENT NO.         : 8,665,015 B1
APPLICATION NO.    : 13/588330
DATED              : March 4, 2014
INVENTOR(S)        : Konstantinos Manetakis Page 1 of 1

It is certified that error appears in the above-identified patent and that said Letters Patent is hereby corrected as shown below:

In the Specification

At column 3, line number 17, delete "cascade" and replace with --cascode--.

Signed and Sealed this
Twenty-fourth Day of June, 2014

Michelle K. Lee
*Deputy Director of the United States Patent and Trademark Office*